(12) United States Patent
Böhne

(10) Patent No.: US 7,257,473 B2
(45) Date of Patent: Aug. 14, 2007

(54) STEERING COLUMN SWITCH SYSTEM COMPRISING AN EMERGENCY OPERATION FUNCTION

(75) Inventor: Gregor Böhne, Castrop-Rauxel (DE)

(73) Assignee: Leopold Kostal GmbH & Co. KG, Ludenscheid (DE)

( * ) Notice: Subject to any disclaimer, the term of this patent is extended or adjusted under 35 U.S.C. 154(b) by 0 days.

(21) Appl. No.: 11/449,401

(22) Filed: Jun. 8, 2006

(65) Prior Publication Data

US 2006/0226797 A1 Oct. 12, 2006

Related U.S. Application Data

(63) Continuation of application No. PCT/EP2004/014201, filed on Dec. 14, 2004.

(30) Foreign Application Priority Data

Dec. 16, 2003 (DE) ................ 103 58 838

(51) Int. Cl.
*G06F 19/00* (2006.01)

(52) U.S. Cl. .............. 701/29; 701/36; 307/10.1; 250/214 PR; 200/61.54

(58) Field of Classification Search ............. 701/1, 701/29, 34, 36; 341/10, 13, 16, 31; 307/10.1; 250/214 SW, 214 PR; 200/61.27, 61.35, 200/61.54

See application file for complete search history.

(56) References Cited

U.S. PATENT DOCUMENTS

| 5,049,879 | A | 9/1991 | Symonds |
| 5,710,400 | A | 1/1998 | Lorenz et al. |
| 5,748,112 | A | 5/1998 | Glonner |
| 5,949,149 | A * | 9/1999 | Shitanaka et al. ......... 307/10.1 |
| 6,365,852 | B1 | 4/2002 | Leng et al. |
| 6,469,642 | B1 | 10/2002 | Kreppold |
| 6,495,832 | B1 * | 12/2002 | Kirby ..................... 250/341.7 |
| 6,800,839 | B2 | 10/2004 | Boehne |
| 6,989,526 | B2 * | 1/2006 | Bohne et al. .............. 250/229 |
| 2004/0144914 | A1 | 7/2004 | Boehne |

FOREIGN PATENT DOCUMENTS

DE 198 52 227 A1 5/2000

* cited by examiner

*Primary Examiner*—Gary Chin
(74) *Attorney, Agent, or Firm*—Brooks Kushman P.C.

(57) ABSTRACT

A steering column switch system includes a device for recording the position of the steering column switch. The device converts the switching position that has been adopted by the steering column switch into a bit pattern. A decoding unit assigns a switching function to the bit pattern of the position that has been identified. Another device recognizes errors during the detection or transmission of the bit patterns. The decoding unit modifies the assignments between the bit patterns and the switching functions to be initiated as a function of the bit pattern errors.

12 Claims, 3 Drawing Sheets

| Position 2 | Intermittent Position 1 Position 2 | Off Position | Momentary wiping Intermittent / Position 1 Position 2 off | |
|---|---|---|---|---|
| | | 1111 | 1100 | Rear Washing |
| 0101 | | 1101 | | Rear Intermittent |
| 0111 | 0001 | 1001 | 1000 | Nirmal Position |
| 0011 | | 1011 | 1010 | Front Washing |

STEERING COLUMN SWITCH SYSTEM COMPRISING AN EMERGENCY OPERATION FUNCTION

CROSS-REFERENCE TO RELATED APPLICATIONS

This is a continuation of International Application PCT/EP2004/014201, published in German, with an international filing date of Dec. 14, 2004, which claims priority to DE 103 58 838.8 filed Dec. 16, 2003, the disclosures of which are both hereby incorporated by reference.

BACKGROUND OF THE INVENTION

1. Field of the Invention

The present invention relates to a motor vehicle steering column switch system having a switch detector, a decoder, and an error identifier in which the switch detector detects the position of a steering column switch lever and converts detected switch positions into corresponding bit patterns, the decoder assigns switch functions to the bit patterns, and the error identifier identifies errors in transmission or reception of the bit patterns.

2. Background Art

Modern steering column switch systems do not control components such as blinkers and windshield wipers by directly switching electrical current to the components. Instead, such systems employ a micro-controller which detects the position of the steering column switch lever based on position signals which are indicative of the switch positions. The micro-controller is used to assign a corresponding switch function (e.g., turn on left blinker, turn off rear windshield wiper, etc.) to each switch position. As such, the micro-controller decodes a position signal to determine the corresponding switch function. The micro-controller transmits appropriate control signals to the control units to carry out the switch function corresponding to the position signal (i.e., the switch function corresponding to the position of the switch lever). The control units then carry out appropriate actions to satisfy the switch function.

Commonly assigned U.S. Pat. No. 6,800,839 discloses an opto-electronic switch position detector for detecting the position of a movable switch. The detector includes a light source, a light shutter, and a plurality of light receivers. The light shutter is connected to the switch to move as the switch moves between different switch positions. As a result, the position of the light shutter relative to the light receivers depends on the switch position. The light shutter is in a different position relative to the light receivers for each switch position. For each switch position, the light shutter blocks the light of the light source from reaching certain ones of the light receivers while enabling the remaining ones of the light receivers to receive the light of the light source. Consequently, a different arrangement of the light receivers receive light of the light source for each switch position. As such, the switch positions are determinable as a function of which light receivers receive light of the light source and which light receivers do not receive light of the light source.

As described, the switch positions respectively correspond to different light receiver arrangements in which some of the light receivers are effectively turned on by receiving light of the light source while the remaining light receivers are effectively turned off by not receiving light of the light source. As such, each light receiver arrangement corresponds to a respective bit pattern (e.g., "1001" which means that the first and fourth ones of the light receivers receive light while the second and third ones of the light receivers do not receive light). Thus, each switch position and its corresponding switch function respectively corresponds to a bit pattern.

Control mechanisms such as current measurements, switching sequence monitoring, error codes, etc., make it possible to recognize errors or defects caused by light conduction path interruptions between the light source and the light receivers (i.e., to recognize errors in the transmission or reception of bit patterns). Such errors result in light receivers not receiving light of the light source during the times that the light receivers are suppose to receive the light of the light source.

SUMMARY OF THE INVENTION

A steering column switch system in accordance with the present invention modifies the decoding between switch positions and the corresponding switch functions to take into account transmission or reception errors of bit patterns indicative of the switch positions such that the system functions to its greatest extent possible in spite of the bit pattern errors. The steering column switch system in accordance with the present invention includes a decoder which changes the assignments between (a) the bit patterns indicative of the switch positions and (b) the corresponding switch functions upon errors in the transmission or reception of the bit patterns being detected. As such, the steering column switch system in accordance with the present invention functions to its greatest extent possible in spite of errors in the transmission or reception of the bit patterns as such errors are taken into account by modifying the assignments between the bit patterns and the corresponding switch functions as a function of such errors.

In a preferred embodiment, the steering column switch system includes a detector, a decoder, and an error identifier. The detector detects the position of a steering column switch and converts detected switch positions into corresponding bit patterns. The decoder assigns switch functions to the bit patterns. The error identifier recognizes bit pattern errors. The decoder changes the assignments between the bit patterns and the switch functions upon the error identifier recognizing a bit pattern error.

BRIEF DESCRIPTION OF THE DRAWINGS

A steering column switch system in accordance with an embodiment of the present invention is illustrated in the following drawings in which:

FIG. 3 illustrates bit patterns indicative of windshield wiper switch positions and the corresponding switch functions to which the bit patterns are assigned when bit pattern transmission or reception errors are absent;

DETAILED DESCRIPTION OF THE PREFERRED EMBODIMENT(S)

Figure 1:
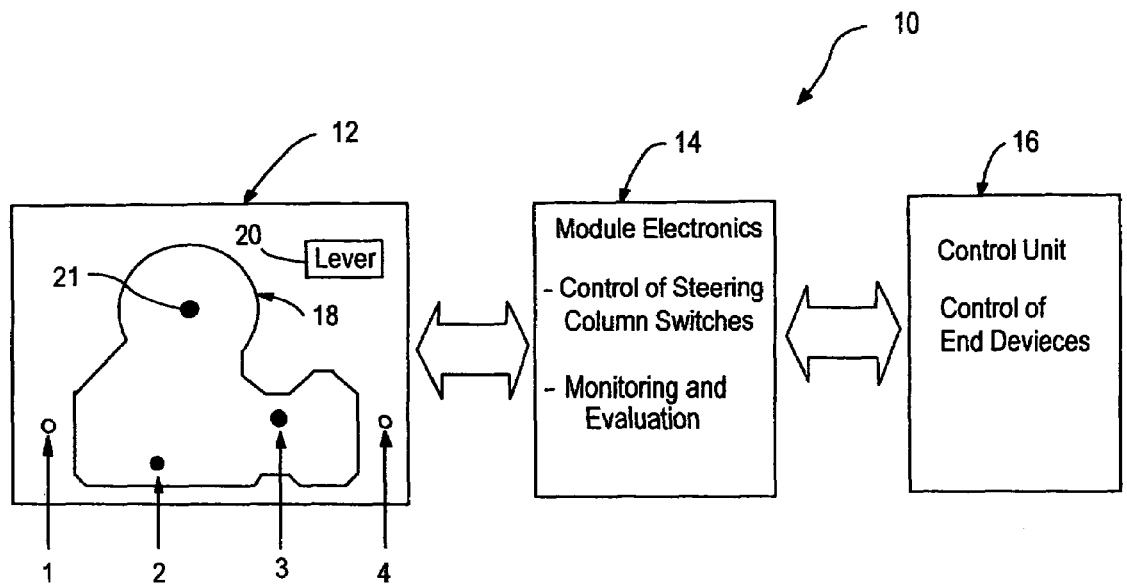
FIG. 1 illustrates a schematic of the basic structure of a steering column switch system in accordance with an embodiment of the present invention.

Referring now to FIG. 1, the basic structure of a steering column switch system 10 for a motor vehicle in accordance with an embodiment of the present invention is shown. System 10 generally includes a switch position detector 12, an electronic control module 14, and a control unit 16.

Switch position detector 12 includes a switch gate (i.e., a light shutter) 18 and a plurality of light-emitting diodes (LEDs) 1, 2, 3, and 4. Switch gate 18 has a given physical contour as shown in FIG. 1. LEDs 1, 2, 3, and 4 are arranged at respective mounting positions with respect to the physical contour of switch gate 18. Switch gate 18 is connected to a movable switch lever 20 such that the switch gate moves as the switch lever moves. As a result, the position of switch gate 18 relative to LEDs 1, 2, 3, and 4 depends on the position of switch lever 20. Switch gate 18 assumes a different position relative to LEDs 1, 2, 3, and 4 for each position of switch lever 20. For each switch lever position, switch gate 18 blocks the light of certain ones of LEDs 1, 2, 3, 4 from reaching a light detector configured to receive light from the LEDs while passing the light of the remaining ones of the LEDs to the light detector. Consequently, a different arrangement of LEDs 1, 2, 3, and 4 provides light to the light detector for each position of switch lever 20. The switch positions of switch lever 20 are determinable as a function of which LEDs 1, 2, 3, and 4 provide light to the light detector (i.e., light shutter 18 passes light from these LEDs to the light detector) and which LEDs 1, 2, 3, and 4 do not provide light to the light detector (i.e., the light shutter blocks light from these LEDs from reaching the light detector).

FIG. 1 illustrates the position of switch gate 18 for a given position of switch lever 20. In this given position, switch gate 18 exposes LEDs 1 and 4 to the light detector (i.e., the switch gate does not cover these LEDs from the light detector) such that light from these LEDs reaches the light detector. In this same position, switch gate 18 blocks LEDs 2 and 3 from the light detector (i.e., the switch gate covers these LEDs from the light detector) such that light from these LEDs does not reach the light detector. Accordingly, the light detector receives a given light pattern of LEDs 1, 2, 3, and 4 when switch gate 18 is in the position shown in FIG. 1. In this position, the given light pattern received by the light detector is "on", "off", "off", and "on". That is, from the point of view of the light detector, LED 1 is on, LED 2 is off, LED 3 is off, and LED 4 is on as the light detector receives light from LEDs 1 and 4 while light from LEDs 2 and 3 is not received even though all of the LEDs are on in the sense that they all are transmitting light.

Each LED pattern received by the light detector corresponds to a bit pattern. For example, the given LED pattern of "on", "off", "off", "on" corresponds to the bit pattern "1001". As another example, the LED pattern of "off", "off", "on", "off" corresponds to the bit pattern "0010". Accordingly, each bit pattern corresponds to a position of switch lever 20. As such, the position of switch lever 20 is determinable from a signal indicative of the bit pattern corresponding to the position of the switch lever.

Circle 21 shown in the top half of switch gate 18 illustrates the basic position of switch lever 20. Other possible positions of switch lever 20 are indicated by rings. If switch lever 20 is moved into a different position, then switch gate 18 causes a bit pattern corresponding to the switch lever position to be generated by exposing certain ones of LEDs 1, 2, 3, and 4 while covering other ones of the LEDs in the manner as described above.

Figure 2:
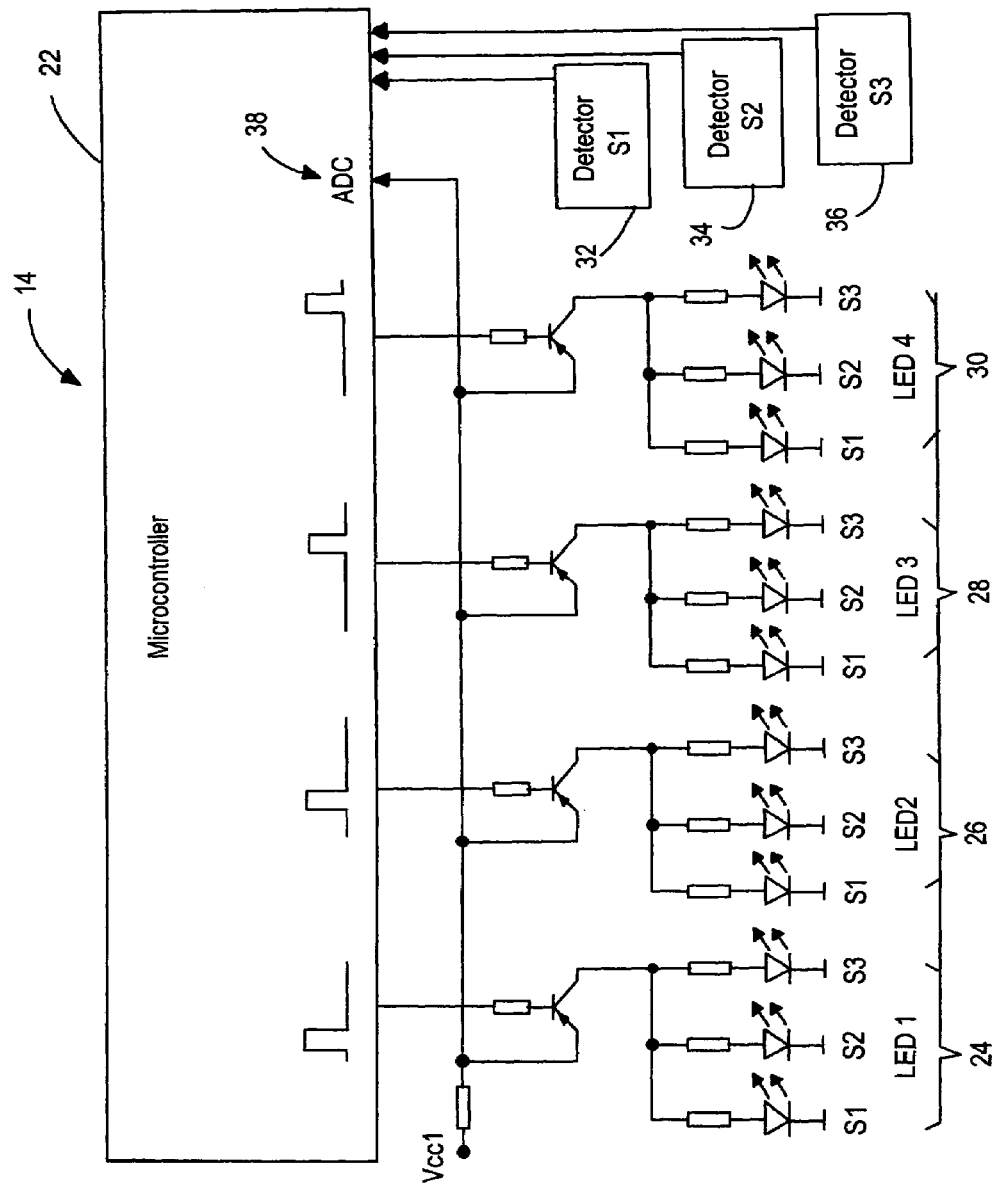
FIG. 2 illustrates a block diagram of the module electronics of the steering column switch system.

Referring now to FIG. 2, with continual reference to FIG. 1, control module 14 of switch system 10 is shown in greater detail. In general, control module 14 respectively assigns switch functions to the possible positions of switch lever 20, detects bit patterns transmitted by an LED arrangement to a light detector, determines the position of the switch lever at a given time upon detecting the corresponding bit pattern, determines the switch function corresponding to the position of the switch lever, and controls corresponding end devices to trigger the switch function corresponding to the position of the switch lever.

Control module 14 includes a micro-controller 22. Micro-controller 22 consecutively controls four LED groups ("LED 1" 24, "LED 2" 26, "LED 3" 28, and "LED 4" 30). As shown as an example, each LED group 24, 26, 28, and 30 includes three LEDs (S1, S2, S3) that are triggered in parallel to generate light. LEDs S1, S2, S3 of LED groups 24, 26, 28, and 30 are respectively associated with different switch gates of switch system 10. For instance, the four LEDs S1 from LED groups 24, 26, 28, and 30 are associated with a first switch gate for detecting the position of a first switch, the four LEDs S2 from LED groups 24, 26, 28, and 30 are associated with a second switch gate for detecting the position of a second switch, and the four LEDs S3 from LED groups 24, 26, 28, and 30 are associated with a third switch gate for detecting the position of a third switch. Thus, the LED arrangement shown in FIG. 2 serves to provide information (i.e., bit patterns) indicative of the positions of three steering column switches such as a blinker switch (S1), a windshield wiper switch (S2), and a cruise control (S3).

The first switch gate exposes or covers certain ones of LEDs S1 relative to a first light detector 32 associated with the blinker switch such that for each position of the blinker switch a corresponding bit pattern of LEDs S1 is received by the first light detector. Similarly, the second (third) switch gate exposes or covers certain ones of LEDs S2 (S3) relative to a second (third) light detector 34 (36) such that for each position of the windshield wiper switch (cruise control) a corresponding bit pattern of LEDs S2 (S3) is received by the second (third) light detector. Light detectors 32, 34, and 36 respectively provide a bit pattern signal indicative of the bit pattern received by the light detectors for their corresponding switches to micro-controller 22. In turn, micro-controller 22 determines the position of each switch from a bit pattern signal provided by the light detector associated with the switch and determines the switch function associated with the position of the switch. Micro-controller 22 then controls control unit 16 to carry out the switch function.

Micro-controller 22 controls LEDs S1, S2, S3 of LED groups 24, 26, 28, and 30 one after another to trigger the LEDs with electrical current for the LEDs to generate light signals for receipt by respective light detectors 32, 34, and 36. As indicated above, the three switch gates respectively expose or cover certain ones of the LEDs depending upon the positions of the switches associated with the switch gates such that the light detectors are enabled to receive or are prevented from receiving the light signals generated by the LEDs.

Micro-controller 22 includes an analog/digital converter (ADC) 38. ADC 38 detects the flow of electrical current through the LED group that is controlled in each case by micro-controller 22. By monitoring the current flowing through LEDs S1, S2, and S3 it is possible to establish, for example, whether any of the LEDs have been unintentionally disabled from generating light signals or whether any of the light detectors have been unintentionally disabled from receiving light signals generated by the LEDs for some reason such as an accident, modification, or anything else. That is, by monitoring the current flowing through LEDs S1, S2, and S3 it is possible to establish whether any errors in the transmission or reception of bit patterns is present. Such an error generally represents an error in the light conduction path between an LED and a light detector.

In the embodiment shown in FIG. 2, LEDs S1, S2, and S3 of the three switches associated with LED groups 24, 26, 28, and 30 are triggered simultaneously to generate light signals. Micro-controller 22 does not control each individual LED current, but rather controls the totals of the respective electrical currents. Thus, when there is an error in the transmission or reception of a bit pattern between an LED S1, S2, and S3 of any of LED groups 24, 26, 28, and 30 and the associated light receiver which unintentionally disables an LED from generating a light signal or which unintentionally disables a light detector from receiving a light signal from the LED, the current monitoring capability provided by ADC 38 provides information about which LED group is effected by the bit pattern error. Such information does not make clear at first as to which of the three switches is effected by the bit pattern error.

Switch system 10 advantageously allows suitable reactions which make it possible to continue to use the system to the greatest possible extent in the presence of bit pattern errors. However, in the presence of a bit pattern error associated with cruise control, switch system 10 does not let the cruise control remain in operation for safety reasons. By contrast, switch system 10 sustains the functions of the blinker switch and the windshield wiper switch to the greatest possible extent in the presence of bit pattern errors.

Figure 4:
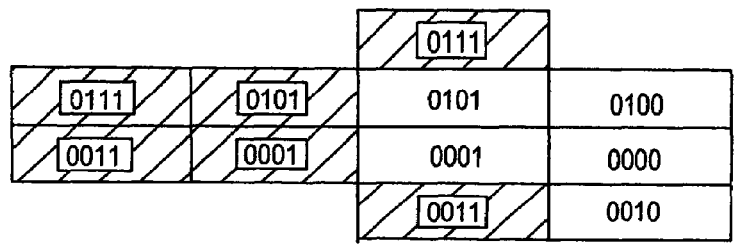
FIG. 4 illustrates bit patterns indicative of windshield wiper switch positions and the corresponding switch functions to which the bit patterns are reassigned when a bit pattern transmission or reception error with respect to the first bit of the bit pattern is present.
Figure 5:
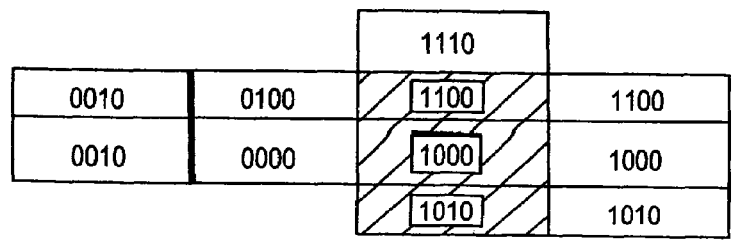
FIG. 5 illustrates bit patterns indicative of windshield wiper switch positions and the corresponding switch functions to which the bit patterns are reassigned when a bit pattern transmission or reception error with respect to the last bit of the bit pattern is present.

Referring now to FIGS. 3, 4, and 5, with continual reference to FIGS. 1 and 2, bit patterns indicative of windshield wiper switch positions and the corresponding switch functions are shown. FIG. 3 illustrates the bit patterns indicative of wiper switch positions and the corresponding wiper switch functions to which the bit patterns are assigned when bit pattern errors are absent. FIG. 4 illustrates the bit patterns indicative of wiper switch positions and the corresponding switch functions to which the bit patterns are reassigned when a bit pattern error with respect to the first bit of the bit pattern is present. FIG. 5 illustrates the bit patterns indicative of wiper switch positions and the corresponding switch functions to which the bit patterns are reassigned when a bit pattern error with respect to the last bit of the bit pattern is present.

For example, in graphic 40 of FIG. 3, the bit pattern "1111" is assigned to the wiper switch function "rear washing off position", the bit pattern "0111" is assigned to the wiper switch function "rear intermittent position 2", etc. Graphic 40 represents the spatial arrangement of the bit pattern codes with respect to the latched position curve of the wiper switch. Each bit pattern has four bits (as there are four LEDs associated with the wiper switch) and each bit is either a "0" or a "1". When bit pattern errors are absent, a "0" in a bit pattern for a given position of the wiper switch means that the light conduction path between the corresponding LED and the light detector is interrupted by the associated switch gate (i.e., the switch gate, which is in a position corresponding to the given position of the wiper switch, covers the corresponding LED from the light detector). A "1" in a bit pattern for a given position of the wiper switch means that the light conduction path between the corresponding LED and the light detector is opened by the associated switch gate (i.e., the switch gate, which is in a position corresponding to the given position of the wiper switch, exposes the corresponding LED to the light detector). A Gray code provides the encoding of the switch positions. Accordingly, adjacent switch positions differ from one another by a single modified bit.

In accordance with the present invention, in the case of a bit pattern error (e.g., if an individual LED burns out), switch system 10 employs suitable planned error reactions to take into account the bit pattern error.

For example, if micro-controller 22 measures a total current too small for LED 2 or LED 3 which implies an error of LED 2 or LED 3, then the micro-controller keeps the wiper switch in operation even though it is no longer possible to perform functions which are signaled by LED 2 or LED 3, that is for which the second or third bit of a bit pattern is set.

FIG. 3 illustrates how micro-controller 22 reads the following functional limitations. If LED 2 is disabled: all rear wiper functions are not working. If LED 3 is disabled: the wiper rear and front wash functions and the direct activation of "position 2" wiping are not working. If either LED 1 or LED 4 is disabled: micro-controller 22 initiates emergency operation of the wiper switch. To initiate emergency operation of the wiper switch, micro-controller 22 associates the detected bit patterns with modified switch functions (i.e., the micro-controller changes the assignments between the bit patterns and the switch functions).

FIGS. 4 and 5 illustrate switch positions having a modified functionality with a shaded background. The fields with a shaded background identify bit patterns which do not occur in an undisturbed system.

FIG. 4 illustrates the bit pattern identified by micro-controller 22 when there is an error in LED 1. If too small a current is measured for LED 1, then the code for "intermittent wiping 1,2" (0001) is detected when the wiper switch is in its off position. The front and rear washing functions are not working. An error is detected if the driver attempts to turn the windshield wipers off.

Following that, micro-controller 22 begins emergency operation with the following switch function assignments:

0000 momentary wiping, intermittent 1,2 off
0001 off position
0010 front washing and momentary wiping
0011 momentary wiping, intermittent 1,2
0100 momentary wiping, intermittent 1,2 off in rear intermittent
0101 rear intermittent
0111 momentary wiping, intermittent 1,2 in rear intermittent Thus, in this emergency operation, rear washing and direct activation of the wiping 2 function does not work, and front washing only works in combination with momentary wiping. If the driver wants to activate the windshield wipers, then the functions are activated too late, but in theory they are activated correctly.

Comparison of the bit patterns produced when LED 4 is out (shown in FIG. 5) with the undisturbed bit pattern assignments (shown in FIG. 3) illustrates that when this error occurs one of the momentary wiping functions is triggered as long as the switch is in the position off/rear intermittent/front washing. If the driver "fiddles around" with the switch, it will assume one of the shaded background positions which have bit patterns that do not occur in an error-free system so that after that it is possible to activate emergency operation.

Emergency operation for this error can provide the following assignment between bit patterns and switch functions:
0000 momentary wiping
0010 turn on wiping 2/turn off wiping 2
0100 momentary wiping in the rear intermittent
0110 turn on wiping 2/turn off wiping 2 in rear intermittent
1000 off position
1100 rear intermittent
1010 front washing
1110 rear washing Thus, in switch system 10 it is possible to recognize bit pattern errors and if switches are not completely defective to maintain a residual functionality either by continuing to operate the switch without change, or activating emergency operation decoding, depending on the defect. A corresponding reassignment when faulty sensor functions are recognized can accordingly also be provided for the blinker only being careful that the switches are, to the greatest possible extent reassigned with functions intuitively expected by the driver. That is, the reassignment does not excessively surprise the driver by unexpected functions. For this reason, a cruise control controlled through a steering column switch should also be completely deactivated if a possible bit pattern error occurs.

The recognition of a bit pattern error can trigger a corresponding error message of micro-controller 22 so that the driver is informed of the bit pattern error, e.g., through a display, and prompted to go to a repair shop.

While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. A steering column switch system for a motor vehicle, the system comprising:
   a detector for detecting the position of a steering column switch and for converting detected switch positions into corresponding bit patterns;
   a decoder for assigning switch functions to the bit patterns; and
   an error identifier for recognizing bit pattern errors;
   wherein the decoder changes the assignments between the bit patterns and the switch functions upon the error identifier recognizing a bit pattern error.

2. The system of claim 1 wherein:
   the decoder changes the assignments between the bit patterns and the switch functions as a function of the bit pattern error.

3. The system of claim 1 wherein:
   the decoder deactivates the switch functions assigned to the bit patterns as a function of the bit pattern error.

4. The system of claim 1 wherein:
   the decoder assigns the switch functions deviating from normal operation to the bit patterns as a function of the bit pattern error.

5. The system of claim 1 comprising:
   a switching device;
   wherein the detector detects the switch positions of the steering column switch using the switching device having a plurality of switch contacts.

6. The system of claim 1 wherein:
   the detector detects the switch positions of the steering column switch using non-contact sensors.

7. The system of claim 6 wherein:
   the non-contact sensors are magneto-sensitive sensors.

8. The system of claim 6 wherein:
   the non-contact sensors are optical sensors.

9. The system of claim 8 wherein:
   the bit patterns assigned to the respective switch positions are acquired as serial signals by cyclic querying of the states of a plurality of light barriers.

10. The system of claim 1 wherein:
    the decoder includes a micro-controller which stores an assignment list, wherein the decoder assigns the switch functions to the bit patterns in accordance with the assignment list.

11. The system of claim 10 wherein:
    the decoder revises the assignment list as a function of the bit pattern error.

12. The system of claim 1 wherein:
    the coding of the bit patterns corresponding to adjacent switch positions is done by a Gray code.

* * * * *